(12) United States Patent
Zhao

(10) Patent No.: US 12,131,941 B2
(45) Date of Patent: Oct. 29, 2024

(54) CARRIER DEVICE

(71) Applicant: CHANGXIN MEMORY TECHNOLOGIES, INC., Hefei (CN)

(72) Inventor: Lei Zhao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 590 days.

(21) Appl. No.: 17/435,644

(22) PCT Filed: Apr. 9, 2021

(86) PCT No.: PCT/CN2021/086076
§ 371 (c)(1),
(2) Date: Sep. 1, 2021

(87) PCT Pub. No.: WO2021/227722
PCT Pub. Date: Nov. 18, 2021

(65) Prior Publication Data
US 2023/0062554 A1  Mar. 2, 2023

(30) Foreign Application Priority Data

May 9, 2020 (CN) .......................... 202010385841.4

(51) Int. Cl.
*H01L 21/68* (2006.01)
*B08B 5/02* (2006.01)
*H01L 21/67* (2006.01)
*H01L 21/687* (2006.01)

(52) U.S. Cl.
CPC .......... *H01L 21/68764* (2013.01); *B08B 5/02* (2013.01); *H01L 21/67259* (2013.01); *H01L 21/68785* (2013.01)

(58) Field of Classification Search
CPC ......... H01L 21/68764; H01L 21/67259; H01L 21/68785; B08B 5/02
USPC ....................................... 134/102.1
See application file for complete search history.

(56) References Cited

U.S. PATENT DOCUMENTS 4,966,519 A    10/1990  Davis et al.

FOREIGN PATENT DOCUMENTS

| CN | 101907832 A | 12/2010 |
|----|-------------|---------|
| CN | 102768977 A | 11/2012 |
| CN | 103691703 A | 4/2014 |
| CN | 104056813 A | 9/2014 |
| CN | 204271061 U | 4/2015 |

(Continued)

OTHER PUBLICATIONS

CN102768977A—machine translation (Year: 2012).*

(Continued)

*Primary Examiner* — Tinsae B Ayalew
(74) *Attorney, Agent, or Firm* — Kilpatrick Townsend & Stockton LLP

(57) ABSTRACT

Embodiments of the present disclosure relate to the field of semiconductor manufacturing, and provide a carrier device. The carrier device includes a carrier 11 and a carrying plate 12 rotatably provided on the carrier 11, where in a non-working state, the carrying plate 12 is in an inclined position; in a working state, the carrying plate 12 is in a horizontal position. The present disclosure makes it hard for impurities such as dust to accumulate on the carrier, so as to prevent a photomask from being contaminated and improve the product yield.

9 Claims, 4 Drawing Sheets

(56) References Cited

FOREIGN PATENT DOCUMENTS

| | | | |
|---|---|---|---|
| CN | 105922210 A | 9/2016 | |
| CN | 108091549 A | 5/2018 | |
| CN | 108840085 A | 11/2018 | |
| CN | 208585160 U | 3/2019 | |
| CN | 109643684 A | 4/2019 | |
| CN | 110314897 A | 10/2019 | |
| CN | 110970343 A | 4/2020 | |
| JP | H07335716 A | 12/1995 | |
| JP | H1092902 A | 4/1998 | |
| JP | 2001011637 A | 1/2001 | |
| JP | 2005079373 A | 3/2005 | |
| KR | 1020120111712 A | 10/2012 | |
| WO | WO-2018038334 A1 * | 3/2018 | ........... H01L 21/677 |

OTHER PUBLICATIONS

WO2018038334A1—machine translation (Year: 2018).*
First CN Office Action cited in CN202010385841.4, mailed May 23, 2023,.
International Search Report cited in PCT/CN2021/086076 mailed Jul. 6, 2021, 8 pages.

\* cited by examiner

CARRIER DEVICE

CROSS REFERENCE TO RELATED APPLICATION

This patent application claims the benefit and priority of Chinese Patent Application No. 202010385841.4 filed on May 9, 2020, the disclosure of which is incorporated by reference herein in its entirety as part of the present application.

TECHNICAL FIELD

The present disclosure relates to the field of semiconductor manufacturing, in particular to a carrier device.

BACKGROUND

In the semiconductor manufacturing process, impurities such as dust in the workshop need to be controlled to meet the production needs, and the clean room usually maintains a certain pressure to encourage the internal air to flow from top to bottom to maintain the cleanliness of the clean room.

SUMMARY

An objective of the present disclosure is to provide a carrier device. The present disclosure makes it hard for impurities such as dust to accumulate on a carrier, so as to prevent a photomask from being contaminated and improve the product yield.

In order to solve the above technical problem, an embodiment of the present disclosure provides a carrier device. The carrier device includes a carrier and a carrying plate rotatably provided on the carrier, where in a non-working state, the carrying plate is in an inclined position; in a working state, the carrying plate is in a horizontal position.

Compared with the prior art, in the embodiment of the present disclosure, the carrying plate is rotatably provided on the carrier. In the working state, the carrying plate is in a horizontal position, such that the carrying plate can stably carry a photomask. In the non-working state, the carrying plate is in an inclined position, such that under the action of air flowing from top to bottom, impurities such as dust naturally slide off without easily accumulating on the carrying plate. In other words, contaminant particles are removed by the airflow in a clean room, preventing the photomask from being contaminated and improving the product yield.

In addition, the carrier may include a main body part, a carrying part and a conveying channel; the carrying part may be provided in the main body part, with one side exposed to an outer surface of the main body part; the carrying plate may be provided on the carrying part; the conveying channel may be provided directly above the carrying part, and may be configured to convey a photomask to the carrying plate; the carrying part may have a first surface and a second surface adjacent to the first surface; the second surface and the outer surface of the main body part may be adjacent and are in the same plane; the main body part may have a third surface, and the third surface may surround the first surface to define the conveying channel.

In addition, an avoiding part may be provided on the main body part; at least one arc-shaped sliding rail may be provided on an inner wall of the avoiding part; the carrying plate may include a fixed end rotatably provided on the carrying part and a free end provided away from the fixed end; the free end may be slidably provided on the sliding rail.

In addition, the carrier device may further include a sensor for detecting a position of the photomask and a driver for driving the carrying plate to rotate; when the sensor detects that the photomask is close to the carrying plate, the driver may drive the carrying plate to be in the horizontal position; when the sensor detects that the photomask is far away from the carrying plate, the driver may drive the carrying plate to be in the inclined position. In this way, the present disclosure can realize the automatic switching between the inclined position of the carrying plate in the non-working state and the horizontal position of the carrying plate in the working state, thereby improving the convenience.

In addition, the photoelectric sensor may be provided on the main body part and located in the conveying channel. In this way, the present disclosure can control the carrying plate to rotate to the horizontal position in advance.

In addition, the carrier device may further include a gas supplier provided on the main body part and used to blow a gas toward the carrying plate; the gas supplier may include a first gas pore structure with aperture direction being vertically downward and a second gas pore structure with aperture direction being horizontal direction; the first gas pore structure and the second gas pore structure may be respectively provided above the carrying plate. In this way, the present disclosure can blow up impurities on the carrying plate through the first gas pore structure to prevent the impurities from adhering to the carrying plate, and can blow the blown impurities away from the carrying plate through the second gas pore structure, thereby further improving the cleanliness of the carrier.

In addition, the first gas pore structure may be telescopically provided in the horizontal direction. In this way, the present disclosure prevents the first gas pore structure from blocking the conveyance of the photomask in the conveying channel, such that the first gas pore structure can be provided directly above the carrying plate, which is beneficial to miniaturize the carrier device.

In addition, a pressure of a gas blown by the first gas pore structure may be greater than a pressure of a gas blown by the second gas pore structure. In this way, the present disclosure can reduce the power consumption of the carrier device while ensuring that the impurities adhered to the carrying plate can be blown up.

In addition, the first gas pore structure may include at least one first movable gas pore that is rotatable; the first movable gas pore may have a rotation angle of 10-170°; the second gas pore structure may include at least one second movable gas pore that is rotatable; the second movable gas pore may have a rotation angle of 0-90°.

In addition, an angle between the inclined position and the horizontal position may be 30-60°.

DETAILED DESCRIPTION OF THE EMBODIMENTS

In order to make the objectives, technical solutions and advantages of the present disclosure clearer, the technical solutions in the embodiments of the present disclosure are clearly and completely described below with reference to the accompanying drawings in the embodiments of the present disclosure. Apparently, the described embodiments are merely a part rather than all of the embodiments of the present disclosure. Other embodiments obtained by those of ordinary skill in the art based on the embodiments of the present disclosure without creative efforts should fall within the protection scope of the present disclosure.

There are at least the following problems existing in the prior art. Since the air in the clean room flows from top to bottom, impurities such as dust move downward with the air and are easy to accumulate on the carrier of the carrier device. They will subsequently contaminate the photomask placed on the carrier, resulting in a micro defect or macro chromatic aberration of the product, thereby seriously affecting product yield.

Figure 1:
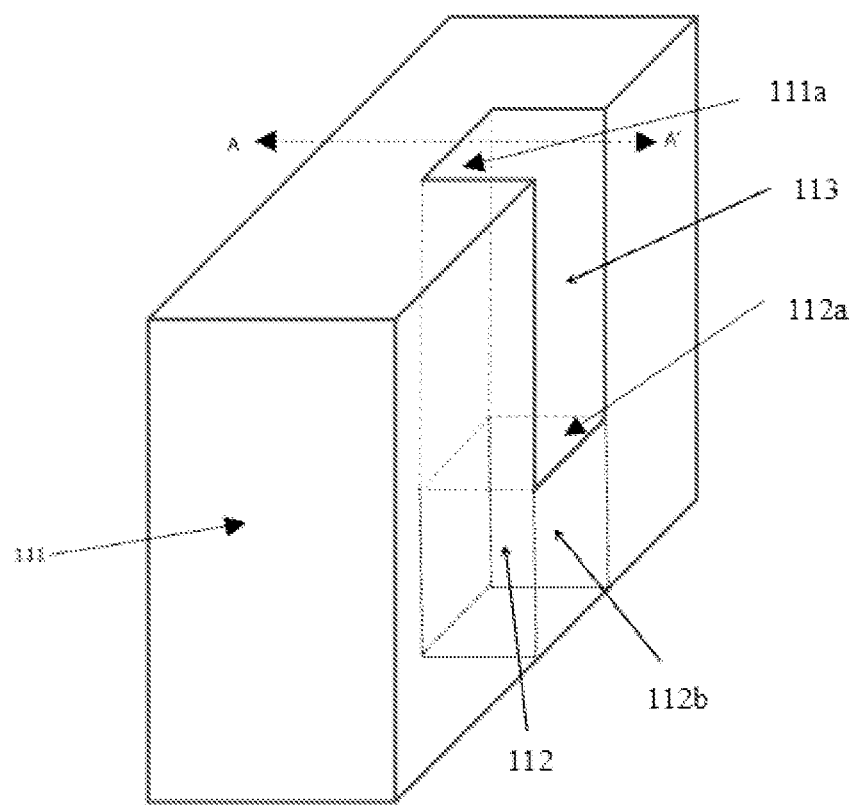
FIG. 1 is a stereoscopic view of a carrier device according to an embodiment of the present disclosure.
Figure 2:
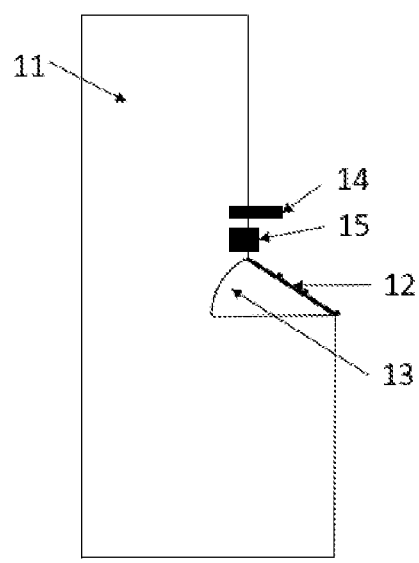
FIG. 2 is a side view along AA' of the carrier device in a non-working state according to an embodiment of the present disclosure.
Figure 3:
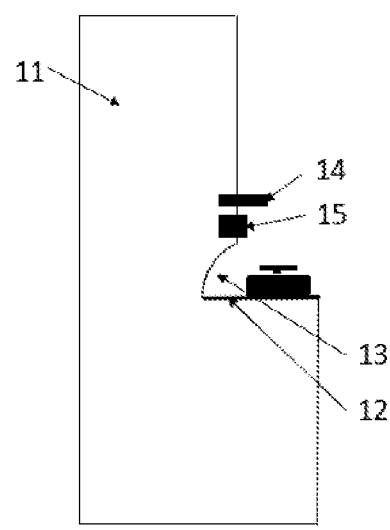
FIG. 3 is a side view along AA' of the carrier device in a working state according to an embodiment of the present disclosure.
Figure 4:
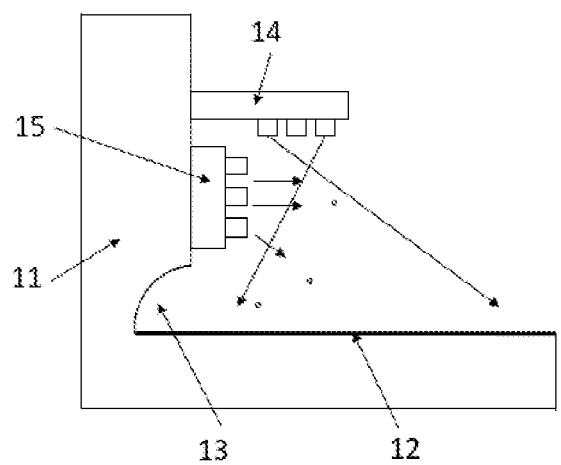
FIG. 4 is a detail of FIG. 3.

An embodiment of the present disclosure relates to a carrier device. As shown in FIGS. 1 to 4, the carrier device includes a carrier 11 and a carrying plate 12 rotatably provided on the carrier 11. In a non-working state, the carrying plate 12 is in an inclined position; in a working state, the carrying plate 12 is in a horizontal position.

In this embodiment, an angle between the inclined position and the horizontal position is 30°-60°, for example, 40°, 45° and 50°. When the angle is in this range, the carrying plate can prevent particles from accumulating, and the size of the carrying plate can be maintained in a reasonable range. Of course, other angle ranges are also within the protection scope of the present disclosure, and are not limited here.

Specifically, the carrier 11 includes a main body part 111, a carrying part 112 and a conveying channel 113. The carrying part 112 is provided in the main body part 111, with one side exposed to an outer surface of the main body part 111. The carrying plate is provided on the carrying part 112. The conveying channel 113 is provided directly above the carrying part 112, and is used for conveying a photomask to the carrying plate. The carrying part 112 has a first surface 112a and a second surface 112b adjacent to the first surface. The second surface 112b and the outer surface of the main body part 111 are adjacent and are on the same plane; the main body part 111 has a third surface 111a. The third surface 111a surrounds the first surface 112a to define the conveying channel 113. Specifically, the third surface 111a is surrounded by three surfaces, namely, an inner surface away from the outer surface of the main body part 111 and two side surfaces adjacent to the inner surface.

In this embodiment, an avoiding part 13 is provided on the main body part 111. At least one arc-shaped sliding rail is provided on an inner wall of the avoiding part 13. The carrying plate 12 includes a fixed end rotatably provided on the carrying part 112 and a free end provided away from the fixed end. The free end is slidably provided on the sliding rail.

Specifically, the avoiding part 13 is provided on the main body part 111 and is located on a side of the inner surface of the conveying channel 113 close to the first surface 112a. The avoiding part 13 is arc-shaped, and an inner wall of a side of the avoiding part facing the carrying part 112a is provided with a corresponding arc-shaped sliding rail, such that the free end of the carrying plate 12 can slide freely along the sliding rail. There is at least one sliding rail. In an embodiment, there may be two sliding rails, which are respectively provided on two sides of the avoiding part 13 close to the two side surfaces of the conveying channel 113. In this way, the carrying plate 12 slides more stably. The fixed end of the carrying plate 12 is located at an abutment of the first surface 112a and the second surface 112b of the carrying part 112.

It can be understood that a first limiting device and a second limiting device may also be provided on the inner wall of the avoiding part 13. When the free end of the carrying plate 12 is located at the first limiting device, the carrying plate 12 may be in the horizontal position. When the free end of the carrying plate 12 is located at the second limiting device, the carrying plate 12 may be located in the inclined position. Optionally, one or more limiting devices may be provided between the first limiting device and the second limiting device, so as to adjust a slope of the carrying plate 12.

In an actual application, the carrier device may further include a sensor for detecting a position of the photomask and a driver for driving the carrying plate 12 to rotate. When the sensor detects that the photomask is close to the carrying plate 12, the driver drives the carrying plate 12 to be in the horizontal position. The photomask is placed on the carrying plate 12, and the carrier device starts to work. When the sensor detects that the photomask is far away from the carrying plate 12, the driver drives the carrying plate 12 to be in the inclined position, so as to prevent impurities such as dust from accumulating on the carrying plate 12. In this way, the present disclosure can realize the automatic switching between the inclined position of the carrying plate 12 in the non-working state and the horizontal position of the carrying plate in the working state, thereby improving the convenience.

In this embodiment, the sensor is provided on the main body part 111 and located in the conveying channel 113. In this way, in the present disclosure the carrying plate can be controlled to rotate to the horizontal position in advance. The sensor may be a photoelectric sensor. The photoelectric sensor is provided on the third surface 111a of the main body part and located in the conveying channel 113. Further, a position of the photoelectric sensor is higher than the avoiding part 13 to ensure that the carrying plate 12 can respond in time when the photoelectric sensor senses the photomask. When the photomask is conveyed from the conveying channel 113 to the carrying part 112, the photoelectric sensor senses the photomask. At this time, a machine end sends an instruction to drive the driver, and the carrying plate 12 rotates from the inclined position to the horizontal position. When the photomask leaves the carrying part 112 and is conveyed through the conveying channel 113, the photoelectric sensor senses the photomask, and the carrying plate 12 rotates from the horizontal position to the inclined position.

In another embodiment, the carrier device may also be provided with a detection device. The detection device can detect a current position of the carrying plate 12, and the detection device can cooperate with the photoelectric sensor to drive the carrying plate 12. When the photomask is conveyed from the conveying channel 113 to the carrying part 112, the photoelectric sensor senses the photomask. At this time, the machine end sends an instruction to drive the driver, the carrying plate 12 rotates from the inclined position to the horizontal position, and the detection device detects the position of the carrying plate 12. If the carrying plate 12 is not in the horizontal position, the conveyance of the photomask to the carrying plate 112 is stopped, and the machine end issues an alarm. If the carrying plate 12 is in the horizontal position, the conveyance of the photomask to the carrying plate 12 is continued. When the photomask leaves the carrying part 112 and is conveyed through the conveying channel 113, the photoelectric sensor senses the photomask, and the carrying plate 12 rotates from the horizontal position to the inclined position. The detection device detects the position of the carrying plate 12. If the carrying plate 12 is not in the inclined position, the machine end issues an alarm.

In one embodiment, the driver may include a stepper motor. One end of the stepper motor is connected to the machine end, and the other end thereof is connected to the fixed end of the carrying plate 12. The stepper motor drives the carrying plate 12 to rotate around the fixed end according to an instruction from the machine end. In other embodiments, other methods may be used to drive the carrying plate to rotate.

In other embodiments, in order to prevent the sensor from failing to sense the photomask in time due to manual handling of the photomask, a manual button may be provided at the machine end to control the rotation of the carrying plate 12 by the manual button.

Specifically, the photoelectric sensor may be a sensor with an infrared transmitting end and an infrared receiving end. The infrared transmitting end and the infrared receiving end are respectively provided on the two side surfaces of the conveying channel 113. When the photomask is conveyed from the conveying channel 113 to the carrying part 112, the photomask shields an infrared ray transmitted by the infrared transmitting end, and the infrared receiving end receives no signal. At this time, the machine end sends an instruction to drive the driver, and the carrying plate 12 rotates from the inclined position to the horizontal position. When the photomask leaves the carrying part 112 and is conveyed through the conveying channel 113, the photomask passes through the sensor and shields the infrared ray of the infrared transmitting end, and the infrared receiving end receives no signal. At this time, the machine end sends an instruction to drive the driver, and the carrying plate 12 rotates from the horizontal position to the inclined position. It is also possible to reasonably set the position of the sensor such that the infrared receiving end cannot receive the infrared ray when the photomask is at the carrier. In this case, when the photomask leaves the carrying part 112 and is conveyed through the conveying channel 113, the photomask no longer shields the infrared ray transmitted by the infrared transmitting end. The infrared receiving end receives an infrared signal, and the carrying plate 12 rotates from the horizontal position to the inclined position.

It can be understood that the sensor may also be a gravity sensor. In this case, the gravity sensor is provided on the carrying plate 12. When the gravity sensor detects that the photomask is in contact with the carrying plate 12, the driver drives the carrying plate 12 to be in the horizontal position. When the gravity sensor detects that the photomask leaves the carrying plate 12, the driver drives the carrying plate 12 to be in the inclined position.

In an actual application, the carrier device may further include a gas supplier provided on the main body part 111 and used to blow a gas toward the carrying plate 12. The gas supplier includes a first gas pore structure 14 with apertures direction being vertically downward and a second gas pore structure 15 with apertures direction being horizontal direction. The first gas pore structure and the second gas pore structure are respectively provided above the carrying plate 12. The horizontal direction is a direction perpendicular to the inner surface of the third surface 111a of the main body part 111 and extending toward the outer surface of the main body part. Specifically, the first gas pore structure 14 and the second gas pore structure 15 are provided on the third surface 111a of the main body part 111, and may further be provided on the inner surface. The first gas pore structure 14 is located above the second gas pore structure 15. In this way, in the present disclosure, impurities on the carrying plate 12 can be blown up through the first gas pore structure 14 to prevent the impurities from adhering to the carrying plate 12, and the blown impurities can be blown away from the carrying plate 12 through the second gas pore structure 15, thereby further improving the cleanliness of the carrier 11. The gas blown out by the first gas pore structure 14 and the second gas pore structure 15 may be an inert gas such as nitrogen, which is not limited here.

Optionally, the carrying plate 12 includes a lower surface in contact with the carrying part 112 and an upper surface away from the carrying part 112. A distance from the second gas pore structure 15 to the upper surface is greater than a thickness of the photomask. Therefore, when the photomask is placed on the carrying plate 12, the position of the second gas pore structure 15 is higher than a height of the photomask placed on the carrying plate 12, such that the second gas pore structure 15 can fully blow particles and other impurities on the photomask.

In this embodiment, the first gas pore structure 14 is provided telescopically along the horizontal direction. During a cleaning process of the carrier device, the first gas pore structure 14 extends. At this time, the first gas pore structure 14 is located directly above the carrying plate 12. The first gas pore structure 14 blows the gas toward the carrying plate 12 to blow up impurities adhered to the carrying plate 12, and the second gas pore structure 15 blows the blown up impurities away from the carrying plate 12. During an operation process of the carrier device, the first gas pore structure 14 retracts into an extension part 112, and only the second gas pore structure 15 blows the gas toward the carrying plate 12 to blow the impurities away on the photomask. In this way, in the present disclosure, the first gas pore structure 14 is prevented from blocking the conveyance of the photomask in the conveying channel 113, such that the first gas pore structure 14 can be provided directly above the carrying plate 12, which is beneficial to the miniaturization and rationalization of the carrier device. In other embodiments, the second gas pore structure 15 may also be configured to extend and retract in the horizontal direction, so as to further avoid affecting the conveyance of the photomask.

Specifically, during the cleaning process of the carrier device, the first gas pore structure 14 may be used to blow up the impurities adhered to the carrying plate 12, and then the second gas pore structure 15 may be used to blow the blown up impurities away from the carrying plate 12. In this way, in the present disclosure, the impurities on the carrying plate 12 can be removed more easily.

In an embodiment, the first gas pore structure 14 and the second gas pore structure 15 can clean the carrying plate regularly, such as once a day or once a week, and the specific time may be set according to actual conditions.

The first gas pore structure 14 may include at least one first movable gas pore that is rotatable, and the first movable gas pore has a rotation angle of 10-170°. The second gas pore structure 15 may include at least one second movable gas pore that is rotatable, and the second movable gas pore has a rotation angle of 0-90°. The rotation angle is 0° in the horizontal direction, and the rotation angle is a positive angle when the second movable gas pore is perpendicular to the horizontal plane and faces downward. Specifically, during a blowing process, the gas pore structure can also swing or rotate within the range of the rotation angle. Through the rotatable gas pore structures, in the present disclosure, the carrying plate and its surroundings can be cleaned in all directions.

In a practical application, the first pore structure 14 may repeatedly blow for many times (for example, three times), and the second pore structure 15 may also blow repeatedly for many times (for example, three times). Finally, the second pore fixedly blows in the horizontal direction (a direction parallel to the carrying plate 12), thereby completing the cleaning process of the carrier device and preparing for the placement of a photomask.

It can be understood that the first pore structure 14 and the second pore structure 15 may also blow intermittently and alternately several times to improve the cleaning effect, which will not be repeated here.

In this embodiment, the pressure of the gas blown by the first pore structure 14 may be greater than the pressure of the gas blown by the second pore structure 15. Blowing up the impurities adhered to the carrying plate 12 requires a relatively large force, while blowing the blown up impurities away from the carrying plate 12 requires a relatively small force. Therefore, the pressure of the gas blown by the first pore structure 14 is set to be greater than the pressure of the gas blown by the second pore structure 15. In this way, in the present disclosure, the power consumption of the carrier device can be reduced under the premise of blowing up the impurities adhering to the carrying plate 12.

In the prior art, the airflow at the bottom of the carrying plate 12 and the airflow around are not smooth, such that impurities are hard to be discharged smoothly and they accumulate on the carrying plate 12, which is likely to cause contamination. In the embodiment of the present disclosure, the carrying plate 12 is rotatably provided on the carrier 11. In the working state, the carrying plate 12 is in a horizontal position, such that the carrying plate 12 can stably carry a photomask. In the non-working state, the carrying plate 12 is in an inclined position, such that under the action of the air flowing from top to bottom, impurities such as dust naturally slide off without easily accumulating on the carrying plate 12, thereby preventing the photomask from being contaminated and improving the product yield. Meanwhile, since the contaminant particles are removed by means of the airflow in the clean room, part of the power consumption caused by the blowing is saved, and energy saving and emission reduction are realized.

Those of ordinary skill in the art should understand that the above embodiments are specific embodiments for implementing the present disclosure. In practical applications, various changes may be made to the above embodiments in terms of form and details, for example, combining two or more embodiments, without departing from the spirit and scope of the present disclosure.

What is claimed is:

1. A carrier device, comprising a carrier and a carrying plate rotatably provided on the carrier, wherein in a non-working state, the carrying plate is in an inclined position, in a working state, the carrying plate is in a horizontal position, wherein the carrier comprises a main body part, a carrying part and a conveying channel; the carrying part is provided in the main body part, with one side exposed to an outer surface of the main body part; the carrying plate is provided on the carrying part; the conveying channel is provided directly above the carrying part, and is configured to convey a photomask to the carrying plate;

the carrying part has a first surface and a second surface adjacent to the first surface; the second surface and the outer surface of the main body part are adjacent and are in the same plane; the main body part has a third surface, and the third surface surrounds the first surface to define the conveying channel.

2. The carrier device according to claim 1, wherein an avoiding part is provided on the main body part; at least one arc-shaped sliding rail is provided on an inner wall of the avoiding part; the carrying plate comprises a fixed end rotatably provided on the carrying part and a free end provided away from the fixed end; the free end is slidably provided on the sliding rail.

3. The carrier device according to claim 1, wherein the carrier device further comprises a sensor for detecting a position of the photomask and a driver for driving the carrying plate to rotate; when the sensor detects that the photomask is close to the carrying plate, the driver drives the carrying plate to be in the horizontal position; when the sensor detects that the photomask is far away from the carrying plate, the driver drives the carrying plate to be in the inclined position.

4. The carrier device according to claim 3, wherein the sensor is a photoelectric sensor, the photoelectric sensor is provided on the main body part and located in the conveying channel.

5. The carrier device according to claim 3, wherein the carrier device further comprises a gas supplier provided on the main body part and used to blow a gas toward the carrying plate; the gas supplier comprises a first gas pore structure with aperture direction being vertically downward and a second gas pore structure with aperture direction being horizontal direction; the first gas pore structure and the second gas pore structure are respectively provided above the carrying plate.

6. The carrier device according to claim 5, wherein the first gas pore structure is telescopically provided in the horizontal direction.

7. The carrier device according to claim 5, wherein a pressure of a gas blown by the first gas pore structure is greater than a pressure of a gas blown by the second gas pore structure.

8. The carrier device according to claim 5, wherein the first gas pore structure comprises at least one first movable gas pore that is rotatable; the first movable gas pore has a rotation angle of 10-170°; the second gas pore structure comprises at least one second movable gas pore that is rotatable; the second movable gas pore has a rotation angle of 0-90°.

9. The carrier device according to claim 1, wherein an angle between the inclined position and the horizontal position is 30-60°.

* * * * *